United States Patent [19]

Gunderson

[11] Patent Number: 4,645,402

[45] Date of Patent: Feb. 24, 1987

[54] INTEGRATED CIRCUIT HANDLER AUTOMATIC UNLOAD APPARATUS

[75] Inventor: Ernest M. Gunderson, Minneapolis, Minn.

[73] Assignee: Micro Component Technology, Inc., St. Paul, Minn.

[21] Appl. No.: 808,736

[22] Filed: Dec. 13, 1985

[51] Int. Cl.$^4$ ............................................. B65G 47/06
[52] U.S. Cl. .................................... 414/224; 414/222
[58] Field of Search ............... 414/222, 224, 554, 610, 414/661; 209/573, 655

[56] References Cited

U.S. PATENT DOCUMENTS

| | | | |
|---|---|---|---|
| 3,662,881 | 5/1972 | Fineran | 414/222 X |
| 4,304,514 | 12/1981 | Pfaff | 414/224 |
| 4,423,815 | 1/1984 | Boissicat | 209/655 |

*Primary Examiner*—Terrance L. Siemens
*Attorney, Agent, or Firm*—Lawrence N. Nawrocki

[57] ABSTRACT

The present invention is apparatus for automatically unloading integrated circuit devices passing from a test site or test sites of an integrated circuit handler down one or more chutes (64). The apparatus includes a stacker assembly (26) comprising one or more hoppers (34). Further, an accumulator assembly (28) providing a plurality of accumulating apertures (62) formed between various loom elements (58, 60) is provided. A shuttle (50) receives an integrated circuit storage and transfer tube (42) from one of the hoppers (34) and transfers the tube (42) to a position relative to the accumulator assembly (28) wherein it can be lifted off the shuttle (50) and maintained in a column of tubes (42) in an accumulating aperture (62). Eccentric cams (74) can be employed to effect the lifting function, and a plurality of spring clip retainers (168) can be provided to hold the tubes (42) in a position in which they receive integrated circuits passing down the chutes (64) prior to being progressively urged upwardly within the accumulating apertures (62).

10 Claims, 13 Drawing Figures

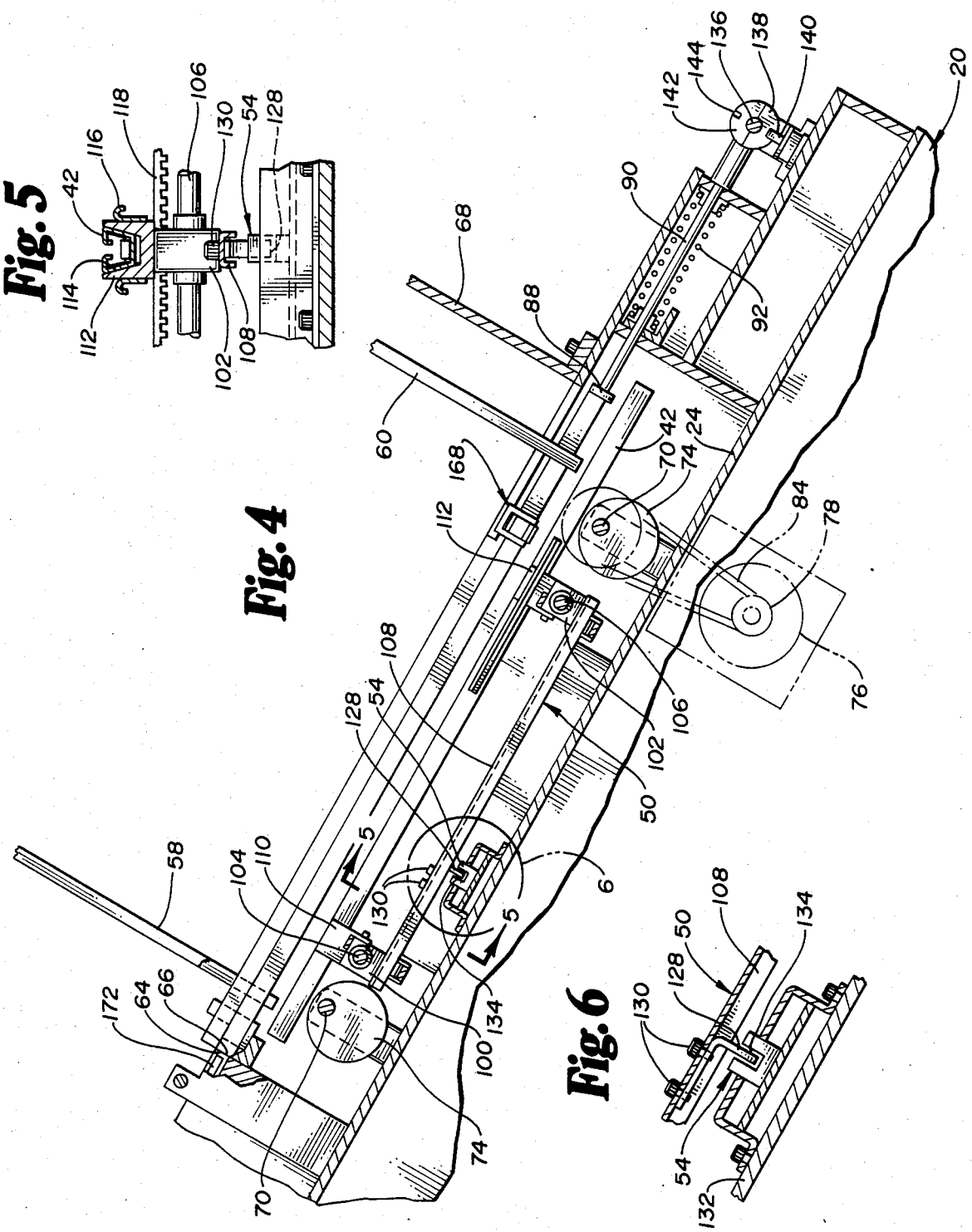

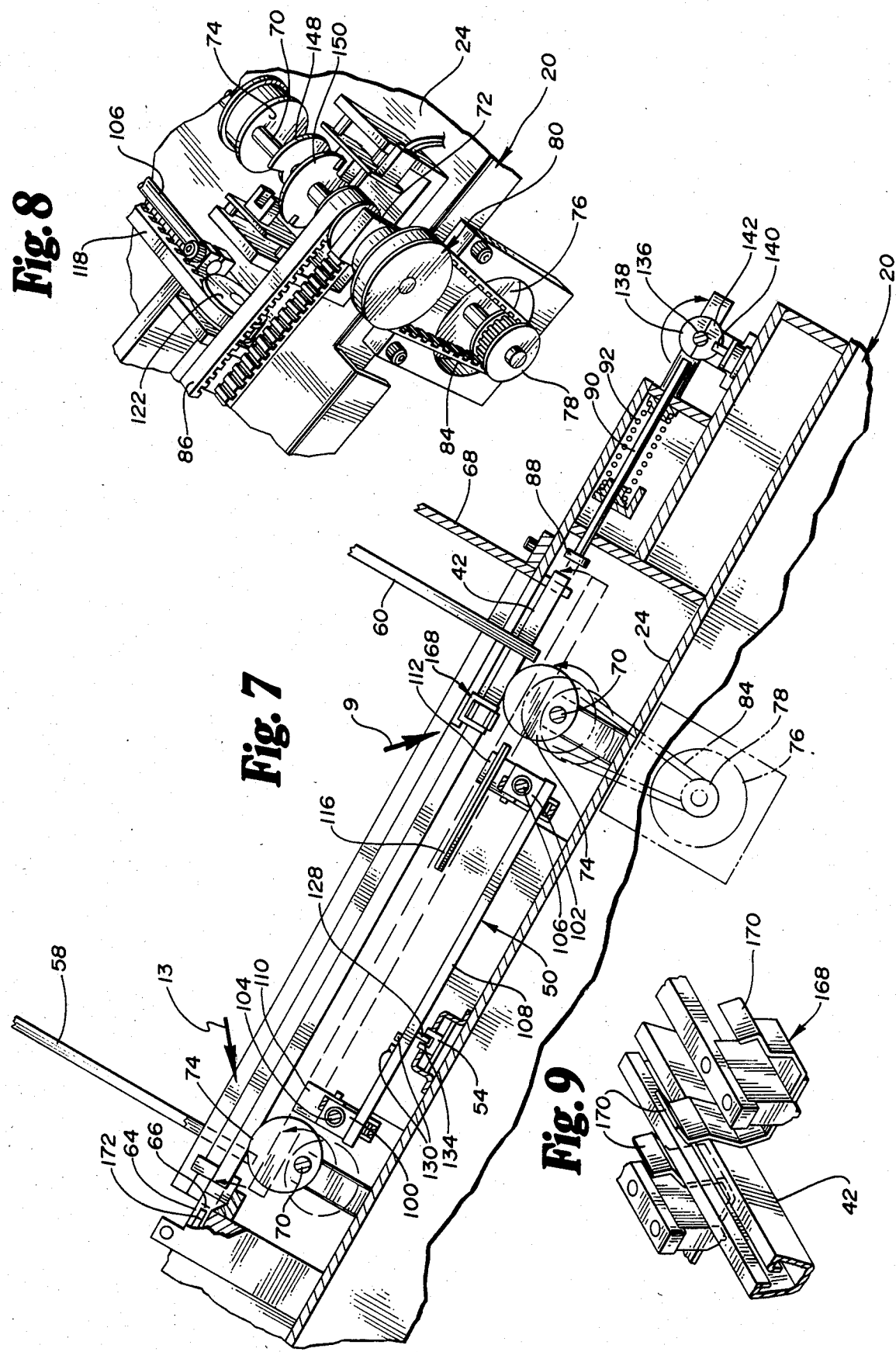

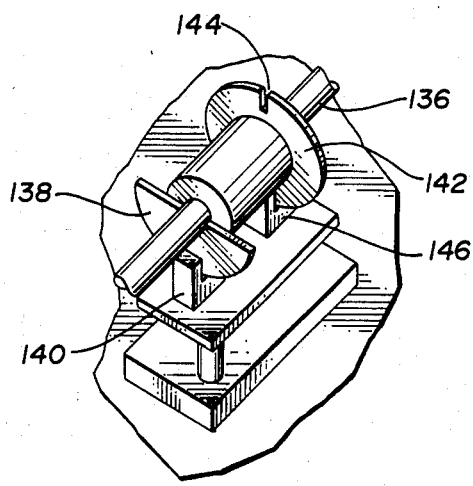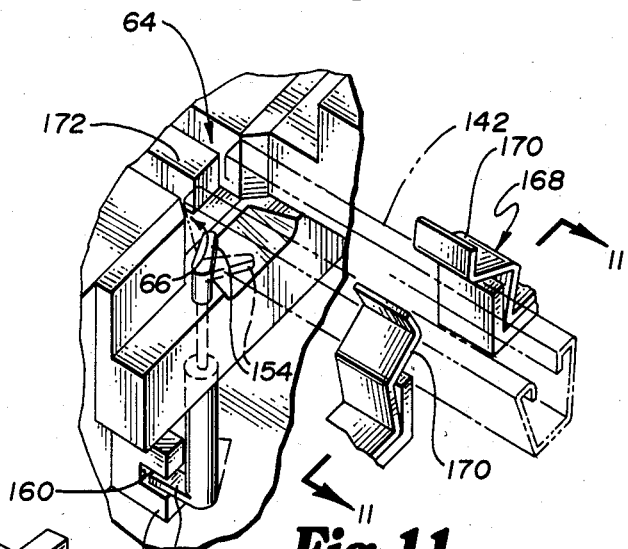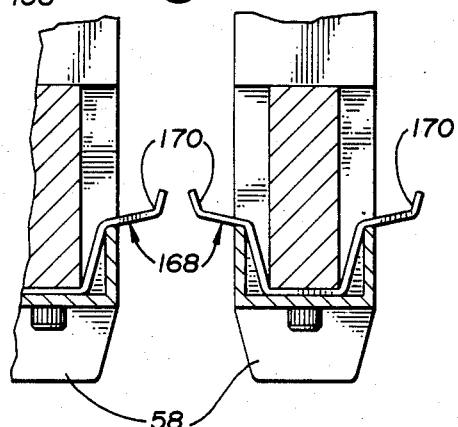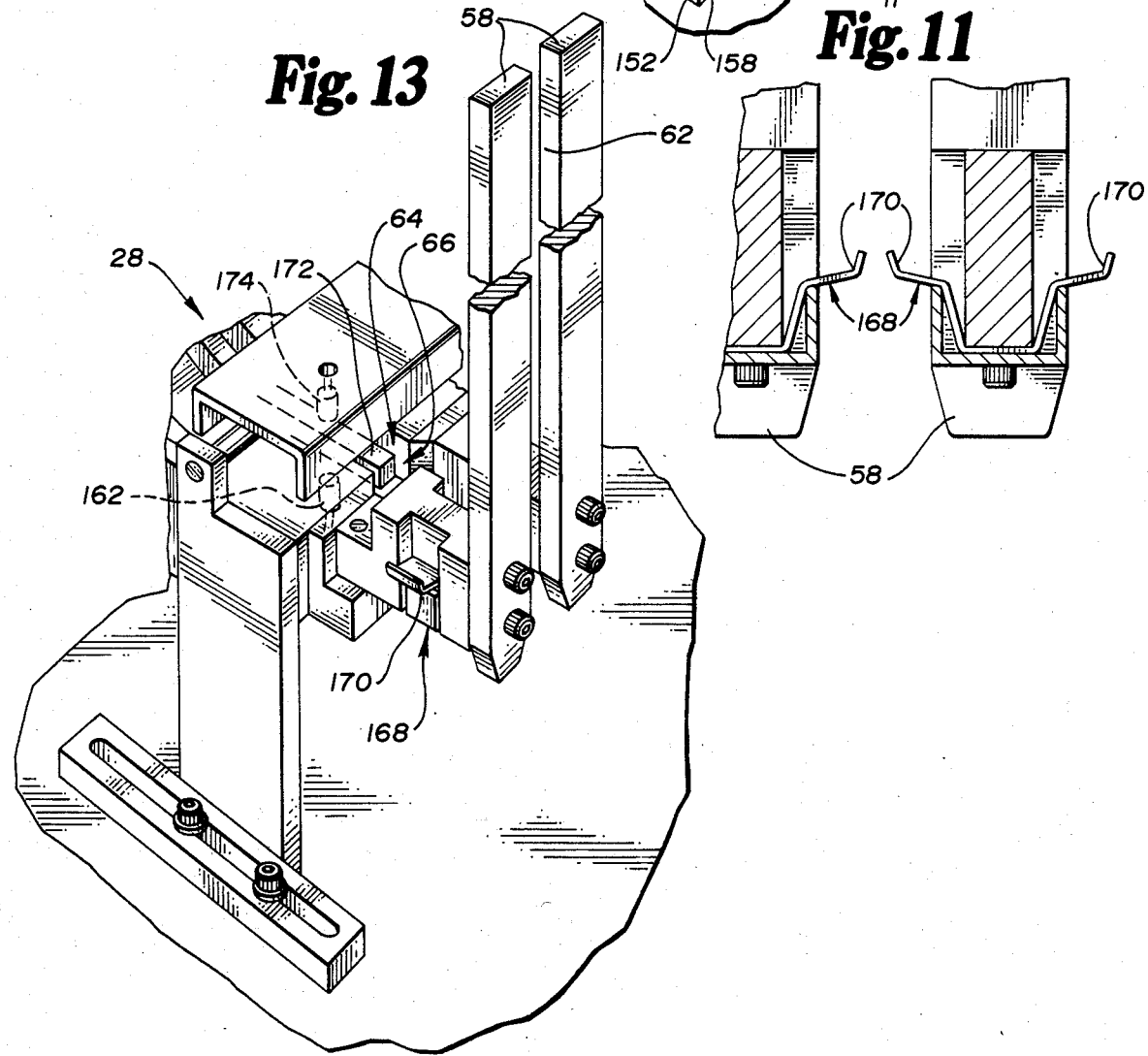

INTEGRATED CIRCUIT HANDLER AUTOMATIC UNLOAD APPARATUS

TECHNICAL FIELD

The present invention deals broadly with the field of electronics and semi-conductors. More narrowly, the invention is related to the field of handlers for maneuvering integrated circuit devices such as dual-in-line packages (DIPs) into engagement with contacts at a test site so that circuits embodied in those devices can be evaluated for proper performance characteristics, for classifying the devices based upon the evaluation of their performance characteristics ascertained, and for depositing the devices into appropriate classification chutes depending upon the integrity of performance characteristics sensed. The invention specifically relates to apparatus for automatically positioning a device storage tube in registration with one of a plurality of discharge chutes to receive integrated circuit devices having been tested, which pass down the chute, and for accessibly presenting successively filled tubes for facile removal by an operator of the handler.

BACKGROUND OF THE INVENTION

Recent years have seen technological advancement as was not experienced at any time in prior history. A significant aspect of this technological advancement has been the electronics revolution. This revolution has been brought about, in significant part, by the development of the semi-conductor. Integrated circuit devices have had a significant impact not only upon the consumer market, but also upon the industrial, governmental, and defense markets.

In these varied markets, semi-conductor devices have numerous and diverse applications. In some of the applications in which integrated circuits are used, a hundred percent integrity is essential. One of such applications might be the space industry where lives and multi-billion dollar investments hinge upon functioning of an apparatus employing the devices. In other applications, however, an IC may not be required to function to as close tolerances as are necessary in more sophisticated applications. In these less critical applications of equipments employing integrated circuit devices, the devices may not need to be completely functional in all circuitry paths.

For numerous reasons, integrated circuit manufacturing processes will produce units of differing qualities. It is, therefore, necessary to test the units manufactured not only to determine merely whether or not they are operable, but also to ascertain the level of quality and degree of operability thereof. Completely functional units can then by used in applications wherein close tolerances and accuracy are essential. Those devices of a lower level of quality and integrity might still, however, be able to be used in less demanding applications.

To accomplish such integrated circuit testing, various types of high speed testing devices have been developed. By use of these devices, quality of function and the level of integrity of various types of integrated circuit devices can be ascertained. Typically, such testers can perform evaluation operations at a rate of in excess of a hundred devices per minute. In view of this high speed operation, it is necessary to provide handling equipment which is capable of feeding units to be tested to the test site and conveying those units away from the test site at at least as rapid a rate.

In many cases, the speed of the operator of the handler is the limiting factor governing the rate of testing performed. While the handler can cycle devices at a high rate of speed to be compatible with the tester, operator speed is limiting even when all that is involved is emptying a string of devices, such as DIPs, from storage and transportation tubes onto tracks provided in an input magazine. One reason for the reduced operational capacity of the operator is that he is required to not only load the devices from storage and transportation tubes into the input section of the handler, but he is also responsible for off-loading tested devices at the output section of the handler.

Easy off-loading is often hampered because of inaccessibility of the tested devices in view of gravity feed, a feed method typically used in handlers. Devices in handlers using such a feed system pass downwardly from the input magazine, through a chute to the test site, and further downwardly through a chute after testing has been performed. Because of this downward passage, unloading has typically been performed through the under-carriage of the handler. In the worst case, operation of the handler might need to be stopped in order to permit the operator to perform off-loading.

In order to eliminate speed problems at the input section, the assignee of all right, title, and interest in and to the present invention, this application, and any patent issuing thereon has developed an automated input system whereby expeditious introduction of devices to be tested can be effectuated. The prior art does not, however, include technology for expediting and facilitating unloading of tested devices.

It is to these problems and desirable features dictated by the prior art that the present invention is directed. It is an apparatus for automatically positioning an integrated circuit device transportation and storage tube in registration with a chute through which devices tested at a test site pass, for receiving the tested devices therein, and for presenting filled tubes to the operator for easy off-loading. All of these functions are performed automatically without requiring the benefit of operator intervention other than filling tube hoppers with the tubes, and removing the tubes as they are presented at the output section of the handler.

SUMMARY OF THE INVENTION

The present invention is a device capable of functioning to effect automatic positioning of a transport tube in which integrated circuit devices, such as dual-in-line packages (DIPs) are stored and transported in registration with a chute discharging from the test site of an integrated circuit handler. The test site interfaces with a high speed testing apparatus. The device further functions to present the tube, when it becomes filled with integrated circuit devices, so that it is accessible for off loading by an operator of the handler. The device includes a hopper which is spaced laterally from the chute from which the integrated circuit devices are discharged. The hopper is intended to receive one or more transport tubes therein. The device incorporates a shuttle including a cradle configured to receive a transport tube therein. The shuttle is disposed for movement between positions proximate the hopper for loading of a tube in the shuttle and proximate the chute for disposing the tube wherein it can be engaged for receipt of integrated circuit devices exiting the chute. A loading station is defined for positioning of the tube in alignment with the egress opening from the chute. The station includes clasping means for holding a tube in alignment with the chute. Means are provided for urging a tube cradled in the shuttle laterally aligned with the chute upward into the clasping means. Finally, means are provided for effecting engagement of an entrance to the tube with the egress opening of the chute once the tube is received in the loading station.

In certain configurations of the invention, a plurality of laterally spaced hoppers can be included. Similarly, the handler with which the present invention is used might employ a plurality of discharge chutes. In such an apparatus, the shuttle would be disposed for movement between positions proximate any of the hoppers, and positions laterally aligned with each of the discharge chutes.

When such pluralities of positions proximate multiple hoppers and multiple chutes are required, each shuttle position proximate a chute would be provided with associated structure to urge a tube carried by the shuttle upwardly into the clasping means of a corresponding loading station. Similarly, each loading station would incorporate its own independent means for bringing a tube at that loading station into engagement and registration with the associated chute.

In the preferred embodiment, the shuttle can be so constructed so that opposite ends of a transport tube extend beyond the shuttle. The means for urging a tube carried by the shuttle upwardly into the clasping means of a particular loading station can take the form of a pair of rotating cans, each for engaging one of opposite ends of the transport tube. Means can be provided to simultaneously rotate the cans, and the cans can be provided with a similar measure of eccentricity so that the orientation of the tube is maintained as it is raised into the loading station.

The clasping means can include a pair of appropriately formed leaf spring fingers so that, as a tube is urged upwardly, the fingers will part to receive the tube therebetween. The fingers can be provided with appropriately constructed ramp surfaces so that, as a subsequent tube is urged upwardly into the station between the clasping means fingers, the tube then received between the fingers will urge upper extremities of the fingers apart so that it can exit upwardly from the clasping fingers. Guides can be provided between which completely filled tubes can be accumulated.

Various sensors can be incorporated into the invention in order to ascertain the presence of a tube at the bottom of a particular hopper, the presence of the shuttle proximate a hopper exit, and the location of the shuttle in a position laterally aligned with a particular discharge chute. Means can be included to govern the egress of a tube from one of the hoppers into the shuttle only in response to a sensed condition wherein a tube is detected in position at the bottom of the particular hopper and the shuttle is positively ascertained to be in position below the hopper to receive the tube as it is released.

The present invention is, therefore, an unload apparatus for automatically effecting positioning of a storage tube proximate a discharge chute, engaging the tube in registration with the egress opening from the chute, and, when the tube is filled, presenting the tube to the operator of the handler in an accessible fashion so that it can be easily retrieved. More specific features of this improvement invention and advantages obtained in view of those features will become more apparent with reference to the DETAILED DESCRIPTION OF THE INVENTION, appended claims, and accompanying drawing figures.

BRIEF DESCRIPTION OF THE DRAWINGS

FIG. 4 is a view taken generally along the line 4—4 of FIG. 2;

FIG. 5 is an enlarged view taken generally along the line 5—5 of FIG. 4;

FIG. 6 is an enlarged view illustrating the structure for sensing the location of the shuttle with respect to the various hoppers and chutes;

FIG. 7 is a view similar to FIG. 4 illustrating the various vertical positions obtainable by a transport tube;

FIG. 8 is an enlarged perspective view of structure employed to urge a shuttle cradled tube upwardly into a particular chute's loading station;

FIG. 9 is an enlarged perspective view illustrating the clasping means for holding a transport tube in a loading station;

FIG. 10 is an enlarged perspective view showing sensing means for ascertaining the presence of a transport tube in registered engagement with the egress opening from the discharge chute;

FIG. 11 is a view taken generally along the line 11—11 of FIG. 10;

FIG. 12 is an enlarged perspective view of the sensor mechanism employed to determine the positioning of plungers used to urge tubes into engaged registration with the egress openings from the various discharge chutes; and FIG. 13 is an enlarged perspective view illustrating various structure proximate the egress openings from the various discharge chutes, and includes a pair of guides between which filled transport tubes are accumulated.

DETAILED DESCRIPTION OF THE INVENTION

Figure 1:
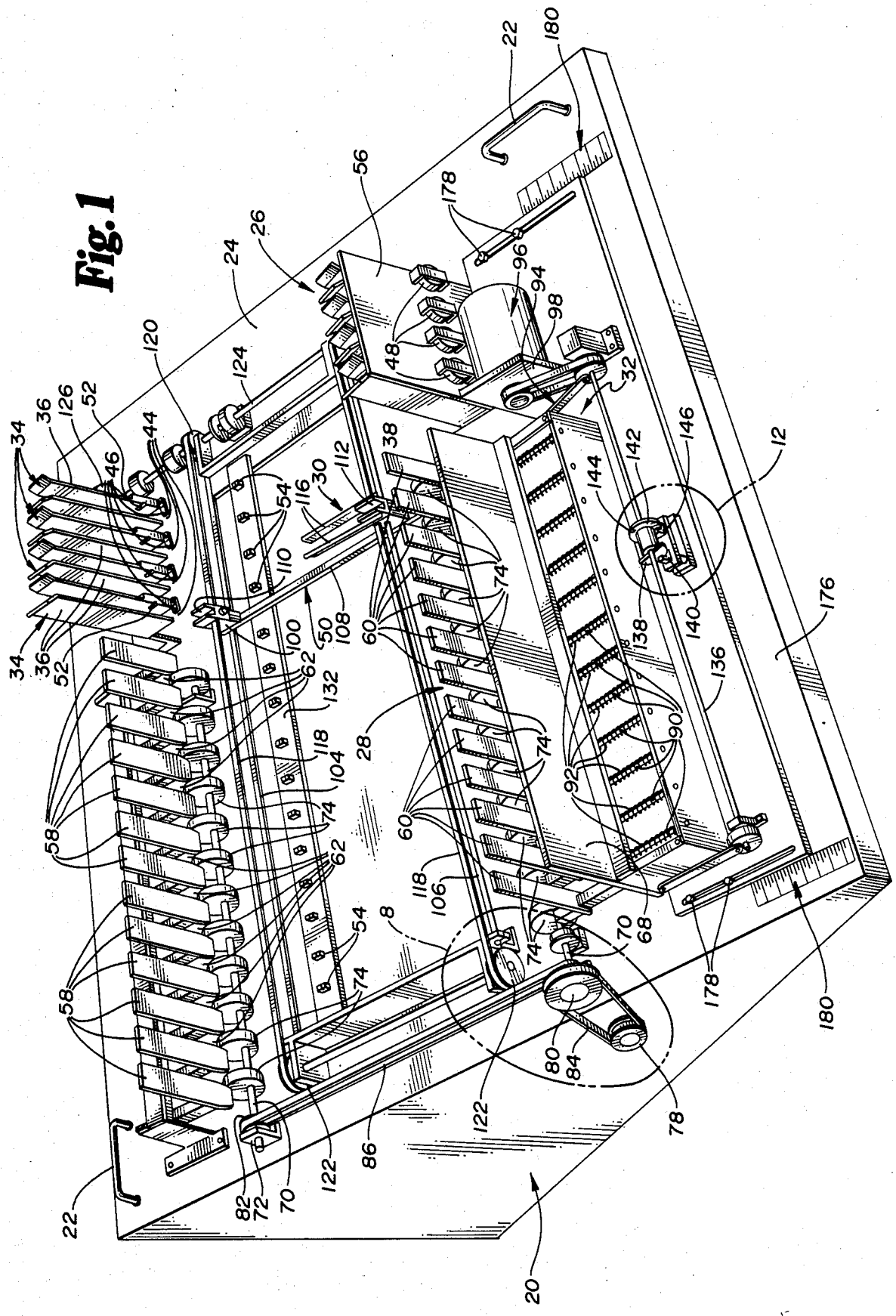
FIG. 1 is a perspective view of a portion of a high-speed, automated handler embodying automatic unload structure in accordance with the present invention.

Referring now to the drawings wherein like reference numerals denote like elements throughout the several views, FIG. 1 illustrates apparatus in accordance with the present invention. The apparatus is shown as including a mounting base 20 which can be transported from one integrated circuit device handler to another, as might be necessary. Transportation handles 22 are provided on an upper surface 24 of the base 20 for this purpose.

Also mounted on the upper surface 24 of the mounting base 20 are the various component assemblies of the automatic unload apparatus in accordance with the present invention. These assemblies include a stacker assembly 26, an accumulator assembly 28, a shuttle assembly 30, and a plunger assembly 32.

The stacker assembly 26 is shown as including a plurality of hoppers 34, although it will be understood that employment of a single hopper 34 is within the scope of the invention. Each hopper 34 comprises an upper and lower support 36, 38, each support 36, 38 being defined by a pair of substantially parallel walls 40. The walls 40 would, typically, define generally vertically oriented planes.

The generally parallel walls 40 of each support 36, 38 are spaced from each other at a desired distance. This distance is selected to correspond, substantially, with a width dimension of an integrated circuit device transport tube 42 as known in the prior art. FIGS. 5, 9, and 10 (and, particularly FIG. 5) illustrate such a tube 42 in cross section. The tube 42 illustrated is one used to store and transport integrated circuit devices known as dual-in-line packages (DIPs) (not shown). As seen in those figures, the cross section of the tube 42 is substantially trapezoidal in shape. DIPs are integrated circuit devices having a generally platen-like main body portion and a row of projecting contact elements extending from two of opposite edges of the main body portion. These contacts are, typically, flared outwardly. When stored in a tube 42 as illustrated in FIGS. 5, 9, and 10, the main body portions of the DIPs are substantially adjacent the shorter of the parallel sides of the cross-sectional trapezoid. The flared contacts extend generally proximate the non-parallel sides of the tube 42.

The width dimension referred to with respect to which the generally parallel walls 40 of a hopper support 36, 38 are spaced is the dimension of the longer of the parallel sides of the cross-sectional trapezoid of a tube 42. The walls 40 are spaced from one another at a distance slightly greater than that dimension so that a tube 42 can be fitted into the supports 36, 38 of one of the hoppers 34 with its smaller parallel edge downward. The tubes 42 can, thereby, be accommodated and be maintained in a particular desired orientation without rotation being easily permitted.

Lower edges of the walls 40 together define an egress port 44 downwardly through which tubes 42 in a particular hopper 34 can pass. The lowermost of the tubes 42 in the hopper 34 is precluded from passing outwardly through the egress port 44 by a discharge gate 46 movable between an extended position in which the port 44 is occluded and a retracted position wherein passage through the port 44 is permitted. The normal position of the gates 46 is one wherein they prevent movement of tubes 42 out of their respective hoppers 34.

Means, such as solenoid actuators 48, can be employed to retract the gates 46 to a particular hopper 34 when it is sensed that a tube 42 is in position at the bottom of the hopper 34 and a shuttle 50 (to be described hereinafter) is in position beneath the egress port 44 to the hopper 34 to receive the tube 42 as it is released. Appropriate sensing means such as flags 52, tripped when a tube 42 is in position, and photosensors 54 (as will be discussed hereinafter with regard to FIG. 6) can be employed to sense the particular conditions.

Lower supports 38 of the stacker assembly 26 can be provided with a retaining wall 56 to preclude tubes 42 placed in the various hoppers 34 from sliding downwardly as a result of the angling of the mounting base 20. The wall 56 would, typically, define a plane orthogonal to the upper surface 24 of the mounting base 20.

The accumulator assembly 28 is spaced laterally from the stacker assembly 26 along the upper surface 24 of the mounting base 20. The accumulator assembly 28 comprises a plurality of upper loom elements 58 spaced laterally from one another and a plurality of lower loom elements 60 spaced laterally from one another to define accumulating apertures 62 therebetween. The loom elements 58, 60 are spaced from one another at a distance to define apertures 62 having a lateral dimension slightly larger than the width dimension of the transport tubes 42, in a fashion similar to the positioning of the parallel walls 40 of the hopper supports 36, 38. Each upper accumulating aperture 62 can be laterally aligned with a corresponding lower accumulating aperture 62 so that transport tubes 42 inserted into corresponding apertures 62 will be maintained generally parallel to tubes 42 stacked in the various hoppers 34.

Corresponding accumulating apertures 62 formed between pairs of upper and lower loom elements 58, 60 are so disposed that, when a tube 42 is received therein, it will be laterally aligned with a chute 64 discharging from a test site (not shown) of an integrated circuit handler. Such test sites are known in the prior art, and they include structure for engaging the contacts of the integrated circuit devices being tested.

Signals are transmitted to, and received from, a device under test in order to ascertain the quality level of the device. After testing is completed, a device passes from an individual of one or more test sites provided, and into a particular discharge chute 64. It is a function of the present invention to bring a transport tube 42 from the tube stacker assembly 26, to the accumulator assembly 28, into registration and engagement with one of the discharge chutes 64, and, after the tube 42 is filled with devices having been tested, urging it upwardly into corresponding upper and lower apertures 62 between loom elements 58, 60 for off-loading by an operator of the handler.

FIGS. 10 and 13 best illustrate the exit of a discharge chute 64, FIG. 10 illustrating in phantom a transport tube 42 in registration and engagement with the exit 66 from the chute 64 to receive devices discharged from the chute 64 therein. Operation to position the tube 42 in registration with the chute 64 will be discussed in more detail here-in-after.

FIG. 1 illustates the accumulator assembly 28 as, in the case of the stacker assembly 26, having a retainer wall 68. Once transport tubes 42 are urged upwardly into the accumulator columns 62, the wall 68 precludes downward sliding of the tubes 42.

The accumulator assembly 28 further includes a pair of rotatable shafts 70, each journaled, at opposite ends thereof, within appropriate mounts 72. Each shaft 70 mounts a plurality of eccentric cams 74, each being similarly sized, shaped, and mounted with respect to the other cams 74 on the shafts 70. Each cam 74 on the upper shaft 70 corresponds and is axially aligned with a cam 74 on the lower shaft 70, and such a pair of cams 74 are laterally aligned with upper and lower corresponding apertures 62 between loom elements 58, 60.

As will be seen hereinafter, when the shuttle 50, which has received a transport tube 42 from one of the hoppers 34, is moved laterally to a position wherein the tube 42 is laterally aligned with an accumulating column 62 location, the shafts 70 can be concurrently rotated, by means of a motor 76 and various pulleys 78, 80, 82 and belts, 84, 86 to rotate the cams to engage undersurfaces of the tube 42. Further rotation of the shafts 70 will cause the tube 42 to be lifted to a point at which it is in registration with the particular discharge chute 64, the size of the cams 74 and their eccentricity being such to effect this measure of lifting. Clasping means (not seen in FIG. 1) can be provided to hold a tube 42 in this position in registration with the desired discharge chute 64. With the tube 42 so held, a plunger 88 can be actuated to urge the tube 42 into engagement with the exit 66 from the particular discharge chute 64 so that devices having been tested can pass down the chute 64 and directly into the tube 42.

A plunger assembly 32 is provided for this purpose. The assembly 32 includes a plurality of plungers 88 corresponding to the number of discharge chutes 64 provided by the handler. The plungers 88 include corresponding plunger shafts 90, as seen in FIG. 1, each biased by appropriate spring means 92 in a direction toward their corresponding discharge chutes 64. A bell crank arrangement 94 and stepper motor 96, mounted to a mounting plate 98, are provided to simultaneously retract the plungers 88 in order to permit the eccentric cams 74 to urge a tube 42 upwardly without it being obstructed by the plunger 88 corresponding to the discharge chute 64 with which it is to be registered. Once the tube 42 is raised to the appropriate height, the plunger 88 can be released by appropriate rotation of the motor 96 so that it drives the tube 42 into engagement with the exit 66 of the chute 64.

As previously indicated, the present invention includes a shuttle assembly 30 having a shuttle carriage 50 by which transport tubes 42 stacked in the various hoppers 34 are translated laterally to an appropriate lateral position relative to the accumulator assembly 28. The shuttle 50 includes upper and lower carriage blocks 100, 102 which ride along corresponding upper and lower rods 104, 106, respectively. The rods 104, 106 extend generally transversely to the orientation of a transport tube 42. The carriage blocks 100, 102 are, in turn, mated together by an elongated member 108.

Each block 100, 102 carries an upwardly projecting saddle 110, 112, said saddles 110, 112 having cradle surfaces 114 to receive a transport tube 42 therein. As best seen in FIG. 5, the cradle surfaces 114 of the saddles 110, 112 are shaped and sized similarly to the external contours of a transport tube 42 as it would address the shuttle 50 as it comes downwardly through the egress ports 44 of a hopper 34. Those contours closely approximate the outer contours of a tube 42 so that, when the tube 42 is received within the shuttle 50, it will not slide downwardly along the angle of incline even when the shuttle 50 is being moved rapidly between the stacker assembly 26 and the accumulator assembly 28.

As seen in FIG. 1, the lower saddle 112 is provided with a pair of side guides 116. These guides 116 initially function to align a transport tube 42 so that it is properly received within the saddles 110, 112.

Each saddle 110, 112 is driven laterally by an endless carriage belt 118 extending over, at one end thereof, a rotatably driven spindle 120 and, at the opposite end thereof, a slave spindle 122. The rotatably driven spindles 120 are mounted to a common shaft 124 which is driven by a motor 126. Movement of the carriage belts 118, therefore, is concurrent. In any case, however, because of the elongated mating member 108 functioning to unify the upper and lower blocks 100, 102 into a unitary structure, lateral movement of one of the blocks 100, 102 would be translated into lateral movement of the other block.

Position photosensors 54 can be provided in order to ascertain the lateral positioning of the carriage 50 with respect to the hoppers 34 and accumulator assembly 28. Such photosensors 54 are best illustrated in FIG. 6 and will be subsequently described with relation to that figure.

As will be apparent in view of the discussion hereinbefore, it is important that the lateral location of the shuttle 50 be able to be ascertained, not only to determine that it is or is not in position beneath a hopper 34 so that tubes 42 in the hopper 34 can be released to deposit one into the saddles 110, 112 of the shuttle 50, but also to determine that the tube 42 carried by the shuttle 50 is laterally aligned with a particular chute 64 from which integrated circuit devices such as DIPs are to be released. FIGS. 4, 5, 6, and 7 (and, particularly, FIGS. 5 and 6) illustrate a structure by which sensing of the lateral location of the shuttle 50 can be effectuated. A tab 128 can be mounted to the elongated mating member 108 by which the upper and lower shuttle blocks 100, 102 are unified into an assembly. The tab 128 can be secured in any appropriate manner such as hexhead screws 130 or similar means.

A plurality of position photosensors 54, as previously indicated, can be affixed to a mounting plate 132 positioned on the upper surface 24 of the mounting base 20. The photosensors 54, when affixed to the mounting plate 132, are aligned so that, as the shuttle 50 moves between one of a number of first positions beneath the various hoppers 34, to one of a number of second positions laterally aligned with the various chutes 64 from which integrated circuit devices are deposited, the tab 128 carried by the shuttle 50 will pass through slots 134 formed in the photosensors 54. Further, the lateral positioning of the photosensors 54 is such that, when the shuttle 50 is in its various second positions laterally aligned with the chutes 64, the tab 128 carried by the shuttle 50 will be received within a slot 134 of one of the various photosensors 54. The tab 128 will, thereby, eclipse an optic receptor from receiving a signal transmitted by a light emission device (LED). This eclipsing of the various optic receptors can be, by means provided for such purpose (not shown), translated into a signal representing an eclipsing condition. This signal is, in turn, transmitted to processor means (not shown) for receiving inputs as to the status and position of various structural elements of the present invention.

Various other sensing mechanisms can be utilized for determining the presence or absence of a particular condition. For example, the bell crank assembly 94 actuated by the stepper motor 96 to effect retraction and extension of the various plungers 88 further includes a shaft 136 which is rotated in one of opposite directions as the bell crank assembly 94 is actuated. A hemi-circular disc 138 is shown as being mounted to this shaft 136 for rotation between a first position, wherein a photosensor 140 is occluded (as seen in FIG. 1), and a second position, wherein the sensor 140 is not occluded. The processor means will have a signal inputted to it depending upon whether or not the photosensor 140 is occluded. In one case, the signal will represent a retracted status of the plungers 88, and, in the other case, a signal will represent an extended status of the plungers 88.

A second parallel disc 142 can also be mounted to the shaft 136. As best seen in FIG. 12, this second disc 142 is substantially completely circular. A slit or slits 144 can be provided extending radially inwardly from the periphery thereof. When the shaft 136 is rotated to a position wherein one of the slits 144 is in registration with its corresponding photosensor 146, eclipsing of the receptor of that photosensor will not occur. This disc 142 can function to discriminate as to the specific position of the plungers 88.

A similar photo-optic sensing array is also illustrated in FIG. 8. The disc 150 and hemi-disc 148 illustrated in that figure functions to sense movement and exact positioning of the various eccentric cams 74 which are rotated to engage the underside of a transport tube 42 positioned in a location laterally aligned with one of the chutes 64 and lift that tube 42 into a position in registration with the particular chute 64.

FIG. 10 also illustrates use of a photosensor 152. When a plunger 88 is actuated to urge a transport tube 42 registered with a particular chute 64 into engagement with the exit 66 from that chute 64, movement of the tube 42 into engagement with the chute 64 will trip a rotatably disposed flag 154. Pivoting of the flag 154 will, in turn, be translated to rotation of a shaft 156 to which it is mounted. Rotation of the shaft 156 will, in turn, effect pivoting of a tab 158, axially spaced along the shaft 156 from the flag 154, into a slit 160 in a photosensor 152. When the receptor of that photosensor 152 is eclipsed, a signal will be sent to the processor means indicating that the tube 42 is in engagement with the chute exit 66 and that, therefore, devices having been tested at the test site can be released to pass into the tube 42.

In operating the handler, a technician would stack empty DIP storage tubes 42 in the various hoppers 34 provided as part of the stacker assembly 26 of the automatic unload apparatus. As devices are tested and pass into a particular chute 34, a photosensor, such as at 162, can sense the presence of devices at a particular chute 64. A stop (not shown) can be provided to preclude releasing of the devices until a transport tube 42 is in engaged registration with the chute 64.

The processor means can function to send a signal to the shuttle drive motor 126 to position the shuttle 50 in one of its first stations beneath the egress port 44 of one of the various hoppers 34 which indicate the presence of empty tubes 42 therein. Once the shuttle 50 is moved to the proper location beneath the egress port 44, its presence will be sensed at that location in a manner discussed here-in-before. The processor means will, therefore, direct the gates 46 at the bottom of the particular hopper supports 36, 38 to open to release the tube 42 into the shuttle 50.

Figure 3:
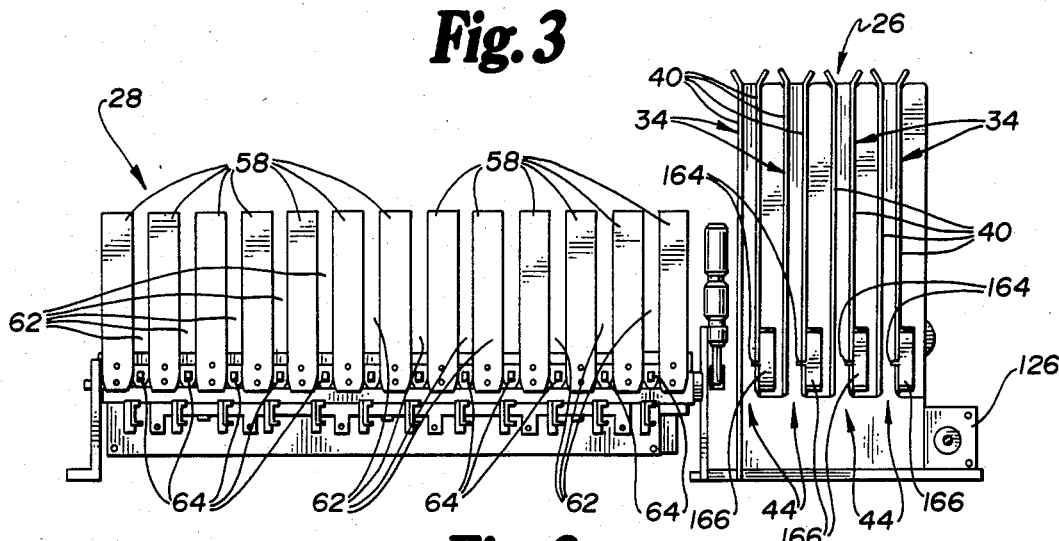
FIG. 3 is a view taken generally along the line 3—3 of FIG. 2.
Figure 2:
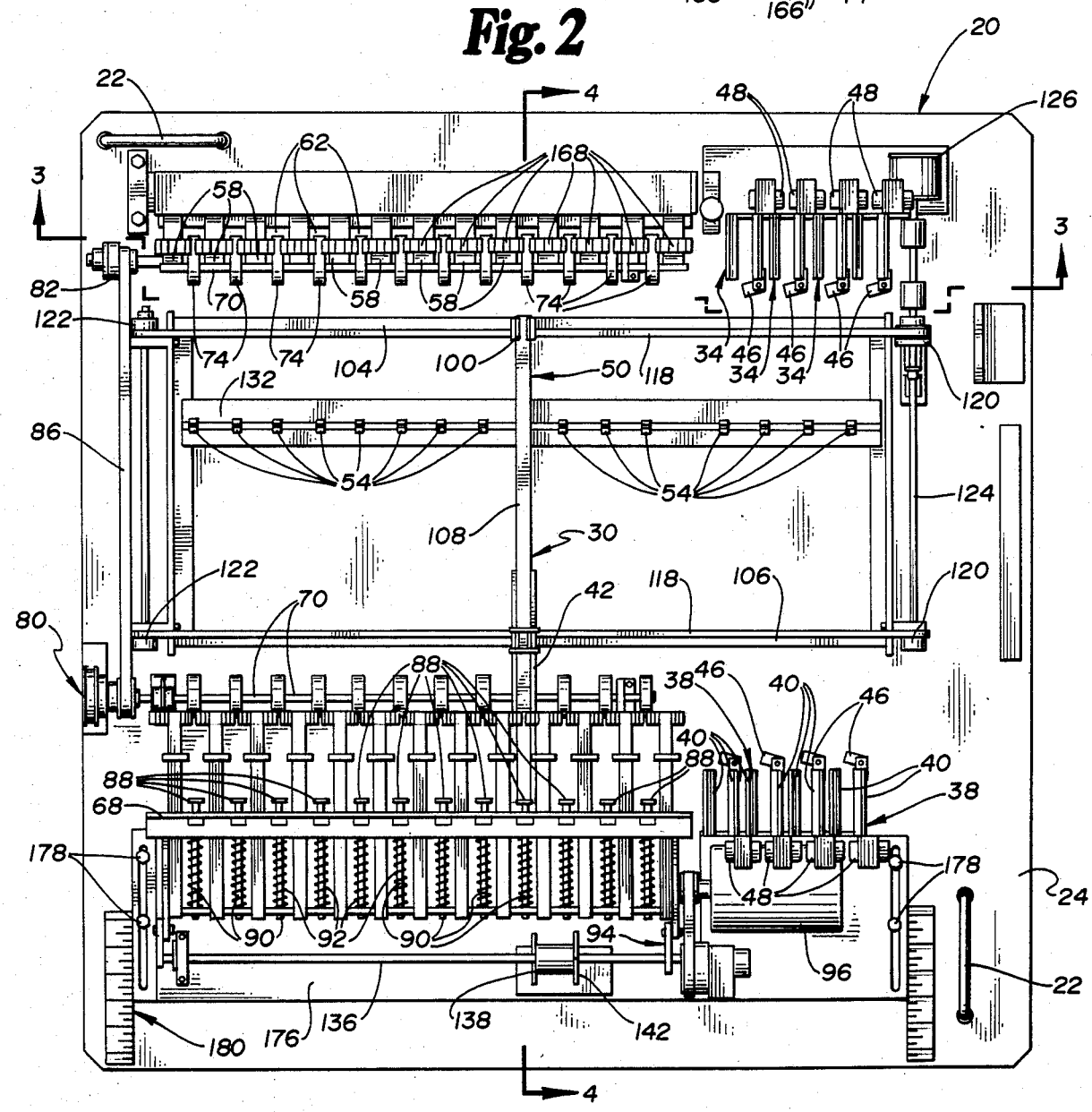
FIG. 2 is a top plan view of the structure illustrated in FIG. 1.

As seen in FIG. 3, each hopper 34 can be provided with a reciprocal shaft 164 extending into its corresponding hopper 34 from a side wall 40 thereof. The vertical location of the shaft 164 can be such that, when the gates 46 of the supports 36, 38 are closed and a stack of empty tubes 42 is held within the hopper 34, the shaft 164 will be positioned proximate the second lowermost tube 42. As the gates 46 are opened, therefore, the processor means can direct an actuator such as a solenoid 166 to extend the particular shaft 164, cooperating with the hopper 34 from which the tube is being released, into the hopper 34 and to hold the second lowermost tube from passing downwardly until the lowermost tube has been released and the gates 46 of the supports 36, 38 have been closed. As the gates 46 are closed, the solenoid 166 will be actuated to retract the shaft 164 to allow the stack of empty tubes 42 to lower onto the gates 46.

By this time, the lowermost tube in the hopper 34 will have been released and been received within the saddles 110, 112 of the upper and lower shuttle blocks 100, 102. With the tube 42 securely received therein, the shuttle 50 will be moved laterally to a second position wherein it is in lateral alignment with the chute 64 from which tested devices are to be released. Presence of the shuttle 50 in the appropriate location will be sensed by the appropriate position photosensor 54 on the mounting plate 132 secured to the upper surface 24 of the mounting base 20.

With the shuttle 50 in this position, the motor 76 driving the shafts 70 to which the eccentric cams 74 are mounted is actuated. The rotation of the motor 76 is transmitted by the pulleys 78, 80, 82 and belts 84, 86 to the shafts 70 to rotate them and, in turn, to rotate the cams 74. The normal position of the cams 74 is one wherein the longer dimensions thereof are extending downwardly. With the cams 74 in these positions, they do not obstruct movement of a tube 42 carried by the shuttle 50. These relative positions of the cams 74 and the shuttle-cradled tube 42 are best seen in FIG. 4.

FIG. 7 illustrates the positions of the eccentric cams 74 and a tube 42 lifted thereby. As can be seen in both FIGS. 4 and 7, the cams 74 would, typically, be positioned with respect to the shuttle 50 at locations with one above the upper block 100 and one below the lower block 102. As the cams 74 are raised, therefore, they will be free to engage the tube 42 and lift the tube 42 from the shuttle saddles 110, 112 without being obstructed by the upper and lower shuttle blocks 100, 102.

As previously discussed, clasping means are provided to receive and hold the tube 42 in a loading position wherein the tube 42 is registered with the particular chute 64. The clasping means are disposed so that they will receive and hold the tube 42 in the loading position once the eccentric cams 74 have raised the tube 42 to its greatest height.

FIG. 11 illustrates a preferred structure for this clasping means. Each upper and lower loom element 58, 60 can carry a spring clip retainer 168. Each of two wings 170 of the retainer 168 can project in opposite directions and cooperate with a similar, symmetrical wing 170 of a retainer 168 carried by an adjacent loom element 58, 60.

FIGS. 9 and 10 illustrate the cooperation of these symmetrical wings 170 as a tube 42 is lifted by the cams 74 and urged between the wings 170. The wings 170 are so configured that, as the tube 42 rises upwardly, it spreads the wings 170 and is received and held therebetween.

As the cams 74 are being rotated to lift the tube 42 into the loading position, the plunger assembly 32 is, by means of its motor 96 and bell crank assembly 94, being synchronously retracted so that the plunger 88 associated with the particular chute 64 with which the tube 42 is being engaged does not obstruct upward movement of the tube 42. As seen in FIG. 4, the normal, extended position of the plunger 88 would, in fact, so obstruct this upward movement. As seen in FIG. 7, however, when the plunger 88 is retracted, the lower end of the tube 42 will be unobstructed by the plunger 88.

Once the tube 42 becomes held within the spring clip retainer configuration, the eccentric cams 74 will again lower. Once the sensor discs 148, 150 determine that the cams 74 are in their lower positions, the plungers 88 will be released, and the operative plunger 88 extends to force the tube 42 into engagement with the exit 66 from the chute 64 from which it is to receive tested integrated circuit devices. As previously discussed, as this engagement is made, the movement of the tube 42 toward the chute 64 will cause the flag 154 to pivot about the axis of its mounting shaft 156 which will, in turn, cause the tab 158 carried at a lower location on the shaft 156 to eclipse the receptor of the photosensor 152. As this eclipsing action occurs, the integrated circuit devices will be permitted to pass down the chute 64, a DIP guide 172 guiding the devices when the devices are DIPs. The devices will pass out of the chute 64 and into the storage tube 42.

As seen in FIG. 13, a counter photosensor arrangement can be provided, a light emission device (LED) 162 directing light upwardly through the path down which the DIPs pass. The receptor 174 will be eclipsed repeatedly as devices pass out of the chute 64. The processor means can be programmed depending upon the number of devices that a storage tube 42 can accommodate. When that number of passages of devices is counted, further passage of devices down that particular chute 64 will be terminated.

As devices are being deposited in any particular tube or tubes 42, the shuttle 50 is free, because of the fact that the tubes 42, when they are in their loading stations in engagement with the particular chutes 64, are held by the spring clip retainers 168, to be moved across the base 20. Once a tube 42 at one chute 64 has been filled, the shuttle 50 can again bring an empty tube 42 to a position beneath the loading station occupied by a filled tube 42. Actuation of the eccentric cams 74 to raise the tube 42 will not only cause the empty tube 42 to be urged into the loading station and held by the retainer clip wings 170, but will also function to displace the loaded tube 42 out of the clasping means and into the accumulator aperture 62 laterally aligned with the chute 64.

As seen in FIG. 7, the lower edges of the loom elements 58, 60 extend to a position so that they are disposed below a tube 42 when it is in its loading station. As a result, as a filled tube is urged upwardly, it will form part of an accumulator column of filled tubes.

As can be seen in view of this disclosure, the process described herein can be repeated any number of times. The operator of the handler need only insure that hoppers 34 are maintained with a number of empty tubes 42 therein and that, as the accumulator columns become filled with uppermost filled tubes approaching the tops of the loom elements 58, 60, the filled tubes are 42 removed and transferred to another area.

One further feature illustrated in FIG. 1 is one wherein the automatic unload apparatus invention can be adapted depending upon the length of the transport tubes 42 being utilized. A plate 176, as seen in FIG. 1, can mount the lower loom element 60 assembly and wall 68, the lower hopper supports 38, and the plunger assembly 32. If longer tubes 42 are desired to be handled, securing nuts 178 can be loosened and the plate 176 adjusted downwardly along the mounting base 20. Indicia 180 can be provided to insure proper positioning of the various structural members.

Similarly, as seen in FIG. 13, the upper loom elements 58 can also be configured so that they are able to be adjusted in a direction along an axis parallel to axes of the storage and transportation tubes 42. Considerable flexibility is, thereby, provided.

Numerous characteristics and advantages of the invention for which this document has been submitted have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. Apparatus for automatically positioning an integrated circuit device transport tube in registration with at least one chute discharging from a test site of an integrated circuit handler and, when the tube becomes full of devices discharged from the chute, presenting the full tube in an accessible fashion for retrieval by an operator of the handler, comprising:
    (a) a hopper, spaced laterally from the at least one chute, for receiving at least one integrated circuit device transport tube;
    (b) a shuttle configured to cradle a transport tube therein and disposed for movement between a first position, at which said shuttle is proximate said hopper for loading of a tube therein, and a second position at which the tube carried by said shuttle is laterally aligned with a chute;
    (c) an integrated circuit device loading station disposed above a shuttle cradled transport tube when said shuttle is in said second position, said station including clasping means for holding the tube in registration with the chute;
    (d) means for urging a tube, when it is cradled in said shuttle in its second position, upwardly into said clasping means; and
    (e) means for engaging one of opposite ends of the transport tube with the chute with which the tube has been registered.

2. Apparatus in accordance with claim 1 wherein said hopper comprises a pair of supports, each defined by a pair of generally vertically extending, substantially parallel walls spaced from each other at a distance approximating a width dimension of a transport tube.

3. Apparatus in accordance with claim 2 wherein each of said supports has a discharge gate, said apparatus further comprising means for sensing the presence of one of opposite ends of an integrated circuit device transport tube seated at each of said gates, and for sensing the presence of said shuttle proximate said hopper, and means, responsive to the sensing of the presence of opposite ends of a transport tube at said gates and the presence of said shuttle proximate said hopper, for releasing the tube into said shuttle.

4. Apparatus in accordance with claim 3 wherein a transport tube, as it is released from said hopper, presents a known contour to said shuttle, and wherein said shuttle has cradle surfaces, substantially conforming to said known contour, formed therein.

5. Apparatus in accordance with claim 1 wherein opposite ends of a transport tube extend beyond said shuttle, said urging means comprising a pair of rotating cams and means for simultaneously rotating said cams, each of said cams, as they rotate, engaging one of opposite ends of the tube to lift the tube out of said shuttle and into said clasping means.

6. Apparatus in accordance with claim 5 wherein a subsequent transport tube urged into said clasping means forces a tube held by said clasping means upwardly and outwardly therefrom, said apparatus further comprising guide means extending upwardly proximate said clasping means to accumulate filled tubes therebetween.

7. Apparatus in accordance with claim 1 wherein said means for engaging one of opposite ends of the transport tube with the chute with which it has been registered comprises a plunger, in registration with an end of the tube opposite that engagable with the chute, disposed for selective movement toward and away from the chute and at a distance therefrom to accommodate the tube therebetween, wherein, as the piston is moved in a first direction, it impels the tube into engagement with the chute.

8. Apparatus in accordance with claim 7 wherein said plunger is biased in a direction toward the chute, and further comprising means for retracting said plunger prior to the tube being urged upwardly into said clasping means when said shuttle is in its second position.

9. Apparatus for positioning an integrated circuit device transport tube in registration and engagement with one of a plurality of laterally spaced chutes discharging from at least one test site of an integrated circuit handler and, when the tube becomes full of devices discharged from a chute, presenting the full tube in an accessible fashion for retrieval by an operator of the handler, comprising:

(a) a hopper, spaced laterally from the chutes, for receiving at least one integrated circuit device transport tube, said hopper including a pair of generally vertically oriented walls spaced from each other at a distance approximating a lateral dimension of a transport tube and defining an egress port between bottom edges of said walls;

(b) a shuttle configured to cradle a transport tube therein and disposed for movement between a first position, below said egress port, for loading of a tube therein, and a plurality of second positions at which the tube carried by said shuttle is laterally aligned with each of the chutes;

(c) clasping means for holding a tube in registration with any one of the chutes to define loading stations, each corresponding to one of the chutes, wherein each of said loading stations is disposed above a shuttle cradled transport tube when said shuttle is in one of said second positions;

(d) means for urging a tube, when it is cradled in said shuttle in one of its second positions, upwardly into said clasping means; and (e) means for engaging one of opposite ends of the transport tube with a chute with which the tube has been registered.

10. Apparatus in accordance with claim 9 wherein opposite ends of a transport tube extend beyond said shuttle, said urging means comprising a plurality of pairs of rotating cams and means for simultaneously rotating said cams, each pair of said cams, as they rotate, engaging a shuttle cradled transport tube to lift the tube out of said shuttle and into said clasping means.

* * * * *